(12) United States Patent
Laubenstein et al.

(10) Patent No.: US 12,457,719 B2
(45) Date of Patent: Oct. 28, 2025

(54) SYSTEMS AND METHODS FOR ADAPTIVE DRIVER FOR INVERTER FOR ELECTRIC VEHICLE

(71) Applicant: BorgWarner US Technologies LLC, Wilmington, DE (US)

(72) Inventors: Peter Allan Laubenstein, Sharpsville, IN (US); Mark Wendell Gose, Kokomo, IN (US); Seyed R. Zarabadi, Kokomo, IN (US); Marc R. Engelhardt, Kokomo, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 224 days.

(21) Appl. No.: 18/171,084

(22) Filed: Feb. 17, 2023

(65) Prior Publication Data

US 2024/0106373 A1    Mar. 28, 2024

Related U.S. Application Data

(60) Provisional application No. 63/378,601, filed on Oct. 6, 2022, provisional application No. 63/377,512, filed
(Continued)

(51) Int. Cl.
*H02M 7/53* (2006.01)
*B60L 3/00* (2019.01)
(Continued)

(52) U.S. Cl.
CPC .......... *H02M 7/5387* (2013.01); *B60L 3/003* (2013.01); *B60L 15/007* (2013.01); *B60L 15/08* (2013.01);
(Continued)

(58) Field of Classification Search
CPC .......... H02J 7/0063; H02M 1/08; H02P 27/08
See application file for complete search history.

(56) References Cited

U.S. PATENT DOCUMENTS

| 4,054,828 A | 10/1977 | Conzelmann et al. |
| 4,128,801 A | 12/1978 | Gansert et al. |
| (Continued) | | |

FOREIGN PATENT DOCUMENTS

| EP | 2157689 A1 | 2/2010 |
| WO | 2007093598 A1 | 8/2007 |
| (Continued) | | |

OTHER PUBLICATIONS

Balogh, L., "Fundamentals of MOSFET and IGBT Gate Driver Circuits," Texas Instruments Application Report, SLUA618—Mar. 2017, Retrieved from internet URL: https://ghioni.faculty.polimi.it/pel/readmat/gate-drive.pdf, 65 pages.
(Continued)

*Primary Examiner* — Rina I Duda
(74) *Attorney, Agent, or Firm* — Joshua M. Haines; Bookoff McAndrews, PLLC

(57) ABSTRACT

A system includes: an inverter configured to convert DC power from a battery to AC power to drive a motor, wherein the inverter includes: a power switch including a drain terminal, a source terminal, and a gate terminal; and one or more controllers configured to: receive one or more signals related to an operation of the power switch, update one or more state definitions based on the received one or more signals, and control a gate control signal to the gate terminal based on the updated one or more state definitions.

19 Claims, 7 Drawing Sheets

Related U.S. Application Data on Sep. 28, 2022, provisional application No. 63/377,501, filed on Sep. 28, 2022, provisional application No. 63/377,486, filed on Sep. 28, 2022.

(51) Int. Cl.

| | |
|---|---|
| *B60L 15/00* | (2006.01) |
| *B60L 15/08* | (2006.01) |
| *B60L 50/40* | (2019.01) |
| *B60L 50/51* | (2019.01) |
| *B60L 50/60* | (2019.01) |
| *B60L 50/64* | (2019.01) |
| *B60L 53/20* | (2019.01) |
| *B60L 53/22* | (2019.01) |
| *B60L 53/62* | (2019.01) |
| *B60R 16/02* | (2006.01) |
| *G01R 15/20* | (2006.01) |
| *G06F 1/08* | (2006.01) |
| *G06F 13/40* | (2006.01) |
| *H01L 21/48* | (2006.01) |
| *H01L 23/00* | (2006.01) |
| *H01L 23/15* | (2006.01) |
| *H01L 23/367* | (2006.01) |
| *H01L 23/373* | (2006.01) |
| *H01L 23/40* | (2006.01) |
| *H01L 23/467* | (2006.01) |
| *H01L 23/473* | (2006.01) |
| *H01L 23/495* | (2006.01) |
| *H01L 23/538* | (2006.01) |
| *H01L 25/00* | (2006.01) |
| *H01L 25/07* | (2006.01) |
| *H02J 7/00* | (2006.01) |
| *H02M 1/00* | (2006.01) |
| *H02M 1/08* | (2006.01) |
| *H02M 1/084* | (2006.01) |
| *H02M 1/088* | (2006.01) |
| *H02M 1/12* | (2006.01) |
| *H02M 1/32* | (2007.01) |
| *H02M 1/42* | (2007.01) |
| *H02M 1/44* | (2007.01) |
| *H02M 3/335* | (2006.01) |
| *H02M 7/00* | (2006.01) |
| *H02M 7/537* | (2006.01) |
| *H02M 7/5387* | (2007.01) |
| *H02M 7/5395* | (2006.01) |
| *H02P 27/06* | (2006.01) |
| *H02P 27/08* | (2006.01) |
| *H02P 29/024* | (2016.01) |
| *H02P 29/68* | (2016.01) |
| *H05K 1/14* | (2006.01) |
| *H05K 1/18* | (2006.01) |
| *H05K 5/02* | (2006.01) |
| *H05K 7/20* | (2006.01) |
| *H10D 64/01* | (2025.01) |
| *B60L 15/20* | (2006.01) |
| *H03K 19/20* | (2006.01) |

(52) U.S. Cl.
CPC .............. *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01); *G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H02J 7/0063* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/53871* (2013.01); *H02M 7/53875* (2013.01); *H02M 7/5395* (2013.01); *H02P 27/06* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2039* (2013.01); *H05K 7/2049* (2013.01); *H05K 7/20854* (2013.01); *H05K 7/209* (2013.01); *H05K 7/20927* (2013.01); *H10D 64/018* (2025.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02P 2207/05* (2013.01); *H03K 19/20* (2013.01); *H05K 2201/042* (2013.01); *H05K 2201/10166* (2013.01)

(56) References Cited

U.S. PATENT DOCUMENTS

| | | | |
|---|---|---|---|
| 4,564,771 | A | 1/1986 | Flohrs |
| 4,618,875 | A | 10/1986 | Flohrs |
| 4,716,304 | A | 12/1987 | Fiebig et al. |
| 5,068,703 | A | 11/1991 | Conzelmann et al. |
| 5,432,371 | A | 7/1995 | Denner et al. |
| 5,559,661 | A | 9/1996 | Meinders |
| 5,654,863 | A | 8/1997 | Davies |
| 5,764,007 | A | 6/1998 | Jones |
| 5,841,312 | A | 11/1998 | Mindl et al. |
| 6,028,470 | A | 2/2000 | Michel et al. |
| 6,163,138 | A | 12/2000 | Kohl et al. |
| 6,351,173 | B1 | 2/2002 | Ovens et al. |
| 6,426,857 | B1 | 7/2002 | Doster et al. |
| 6,597,556 | B1 | 7/2003 | Michel et al. |
| 6,812,553 | B2 | 11/2004 | Gerbsch et al. |
| 6,943,293 | B1 | 9/2005 | Jeter et al. |
| 7,095,098 | B2 | 8/2006 | Gerbsch et al. |
| 7,229,855 | B2 | 6/2007 | Murphy |
| 7,295,433 | B2 | 11/2007 | Taylor et al. |
| 7,459,954 | B2 | 12/2008 | Kuehner et al. |
| 7,538,425 | B2 | 5/2009 | Myers et al. |
| 7,551,439 | B2 | 6/2009 | Peugh et al. |
| 7,616,047 | B2 | 11/2009 | Rees et al. |
| 7,724,046 | B2 | 5/2010 | Wendt et al. |
| 7,750,720 | B2 | 7/2010 | Dittrich |
| 9,088,159 | B2 | 7/2015 | Peuser |
| 9,275,915 | B2 | 3/2016 | Heinisch et al. |
| 9,373,970 | B2 | 6/2016 | Feuerstack et al. |

(56) References Cited

U.S. PATENT DOCUMENTS

| | | |
|---|---|---|
| 9,431,932 B2 | 8/2016 | Schmidt et al. |
| 9,515,584 B2 | 12/2016 | Koller et al. |
| 9,548,675 B2 | 1/2017 | Schoenknecht |
| 9,806,607 B2 | 10/2017 | Ranmuthu et al. |
| 9,843,320 B2 | 12/2017 | Richter et al. |
| 9,871,444 B2 | 1/2018 | Ni et al. |
| 9,882,490 B2 | 1/2018 | Veeramreddi et al. |
| 10,111,285 B2 | 10/2018 | Shi et al. |
| 10,116,300 B2 | 10/2018 | Blasco et al. |
| 10,232,718 B2 | 3/2019 | Trunk et al. |
| 10,270,354 B1 | 4/2019 | Lu et al. |
| 10,291,225 B2 | 5/2019 | Li et al. |
| 10,505,529 B1 | 12/2019 | Takao |
| 10,525,847 B2 | 1/2020 | Strobel et al. |
| 10,784,857 B1* | 9/2020 | Li ................ H03K 17/168 |
| 10,797,579 B2 | 10/2020 | Hashim et al. |
| 10,924,001 B2 | 2/2021 | Li et al. |
| 11,082,052 B2 | 8/2021 | Jang et al. |
| 11,108,389 B2 | 8/2021 | Li et al. |
| 11,171,640 B2* | 11/2021 | Li ................ H03K 17/0828 |
| 11,342,911 B2 | 5/2022 | Lee et al. |
| 11,838,011 B2 | 12/2023 | Li et al. |
| 11,843,320 B2 | 12/2023 | Sivakumar et al. |
| 11,848,426 B2 | 12/2023 | Zhang et al. |
| 11,851,038 B2 | 12/2023 | Solanki et al. |
| 11,855,522 B2 | 12/2023 | Rudolph et al. |
| 11,855,630 B2 | 12/2023 | Dake et al. |
| 11,870,338 B1 | 1/2024 | Narayanasamy |
| 11,872,997 B2 | 1/2024 | Hoos et al. |
| 11,881,859 B2 | 1/2024 | Gupta et al. |
| 11,888,391 B2 | 1/2024 | Balasubramanian et al. |
| 11,888,393 B2 | 1/2024 | Venkateswaran et al. |
| 11,901,803 B2 | 2/2024 | Ruck et al. |
| 11,901,881 B1 | 2/2024 | Narayanasamy |
| 11,909,319 B2 | 2/2024 | Esteghlal et al. |
| 11,916,426 B2 | 2/2024 | Oner et al. |
| 11,923,762 B2 | 3/2024 | Sethumadhavan et al. |
| 11,923,764 B1 | 3/2024 | Zhang |
| 11,923,799 B2 | 3/2024 | Ojha et al. |
| 11,925,119 B2 | 3/2024 | Male et al. |
| 11,927,624 B2 | 3/2024 | Patel et al. |
| 11,938,838 B2 | 3/2024 | Simonis et al. |
| 11,942,927 B2 | 3/2024 | Purcarea et al. |
| 11,942,934 B2 | 3/2024 | Ritter |
| 11,945,331 B2 | 4/2024 | Blemberg et al. |
| 11,945,522 B2 | 4/2024 | Matsumura et al. |
| 11,949,320 B2 | 4/2024 | Jaladanki et al. |
| 11,949,333 B2 | 4/2024 | Pahkala et al. |
| 11,955,896 B2 | 4/2024 | Liu et al. |
| 11,955,953 B2 | 4/2024 | Sinn et al. |
| 11,955,964 B2 | 4/2024 | Agarwal et al. |
| 11,962,234 B2 | 4/2024 | Narayanasamy et al. |
| 11,962,291 B2 | 4/2024 | Oberdieck et al. |
| 11,964,587 B2 | 4/2024 | Yukawa |
| 11,970,076 B2 | 4/2024 | Sarfert et al. |
| 11,977,404 B2 | 5/2024 | Chandrasekaran |
| 11,984,802 B2 | 5/2024 | Merkin et al. |
| 11,984,876 B2 | 5/2024 | Neidorff et al. |
| 11,990,776 B2 | 5/2024 | Dulle |
| 11,990,777 B2 | 5/2024 | Woll et al. |
| 11,996,686 B2 | 5/2024 | Chan et al. |
| 11,996,699 B2 | 5/2024 | Vasconcelos Araujo et al. |
| 11,996,714 B2 | 5/2024 | El Markhi et al. |
| 11,996,715 B2 | 5/2024 | Nandi et al. |
| 11,996,762 B2 | 5/2024 | Hembach et al. |
| 11,996,830 B2 | 5/2024 | Murthy et al. |
| 11,996,847 B1 | 5/2024 | Kazama et al. |
| 12,003,191 B2 | 6/2024 | Chaudhary et al. |
| 12,003,229 B2 | 6/2024 | Kaya et al. |
| 12,003,237 B2 | 6/2024 | Waters |
| 12,008,847 B2 | 6/2024 | Braun et al. |
| 12,009,679 B2 | 6/2024 | Gottwald et al. |
| 12,012,057 B2 | 6/2024 | Schneider et al. |
| 12,015,342 B2 | 6/2024 | Kienzler et al. |
| 12,019,112 B2 | 6/2024 | Jarmolowitz et al. |
| 12,021,517 B2 | 6/2024 | S et al. |
| 2007/0052454 A1* | 3/2007 | Gose ................ G01R 19/0092 |
| | | 327/108 |
| 2016/0099665 A1* | 4/2016 | Chen ................ H02M 7/53871 |
| | | 363/56.02 |
| 2017/0331469 A1 | 11/2017 | Kilb et al. |
| 2020/0067400 A1* | 2/2020 | Li ................ H02M 1/4216 |
| 2020/0195121 A1 | 6/2020 | Keskar et al. |
| 2021/0005711 A1 | 1/2021 | Martinez-Limia et al. |
| 2021/0203257 A1* | 7/2021 | Lakshmi Narasimha ................ |
| | | H02P 6/20 |
| 2022/0052610 A1 | 2/2022 | Plum |
| 2022/0294441 A1 | 9/2022 | Purcarea et al. |
| 2023/0010616 A1 | 1/2023 | Gschwantner et al. |
| 2023/0061922 A1 | 3/2023 | Ritter |
| 2023/0082076 A1 | 3/2023 | Strache et al. |
| 2023/0126070 A1 | 4/2023 | Oberdieck et al. |
| 2023/0179198 A1 | 6/2023 | Winkler |
| 2023/0231210 A1 | 7/2023 | Joos et al. |
| 2023/0231400 A1 | 7/2023 | Oberdieck et al. |
| 2023/0231496 A1 | 7/2023 | Syed et al. |
| 2023/0238808 A1 | 7/2023 | Swoboda et al. |
| 2023/0268826 A1 | 8/2023 | Yan et al. |
| 2023/0335509 A1 | 10/2023 | Poddar |
| 2023/0365086 A1 | 11/2023 | Schumacher et al. |
| 2023/0370062 A1 | 11/2023 | Wolf |
| 2023/0378022 A1 | 11/2023 | Kim et al. |
| 2023/0386963 A1 | 11/2023 | Kim et al. |
| 2023/0402930 A1 | 12/2023 | Corry et al. |
| 2023/0420968 A1 | 12/2023 | Oner et al. |
| 2023/0421049 A1 | 12/2023 | Neidorff |
| 2024/0006869 A1 | 1/2024 | Kim et al. |
| 2024/0006899 A1 | 1/2024 | Wernerus |
| 2024/0006993 A1 | 1/2024 | Barjati et al. |
| 2024/0022187 A1 | 1/2024 | Fassnacht |
| 2024/0022240 A1 | 1/2024 | Balaz |
| 2024/0022244 A1 | 1/2024 | S et al. |
| 2024/0030730 A1 | 1/2024 | Wernerus |
| 2024/0039062 A1 | 2/2024 | Wernerus |
| 2024/0039402 A1 | 2/2024 | Bafna et al. |
| 2024/0039406 A1 | 2/2024 | Chen et al. |
| 2024/0048048 A1 | 2/2024 | Zhang |
| 2024/0055488 A1 | 2/2024 | Lee et al. |
| 2024/0067116 A1 | 2/2024 | Qiu |
| 2024/0072675 A1 | 2/2024 | Formenti et al. |
| 2024/0072817 A1 | 2/2024 | K et al. |
| 2024/0077899 A1 | 3/2024 | Chitnis et al. |
| 2024/0078204 A1 | 3/2024 | Roehrle et al. |
| 2024/0079950 A1 | 3/2024 | Narayanasamy |
| 2024/0079958 A1 | 3/2024 | Kumar et al. |
| 2024/0080028 A1 | 3/2024 | Dake et al. |
| 2024/0088647 A1 | 3/2024 | Ramadass et al. |
| 2024/0088896 A1 | 3/2024 | Bilhan et al. |
| 2024/0097437 A1 | 3/2024 | Goyal et al. |
| 2024/0097459 A1 | 3/2024 | Swoboda et al. |
| 2024/0105276 A1 | 3/2024 | Duryea |
| 2024/0106248 A1 | 3/2024 | Woll et al. |
| 2024/0106435 A1 | 3/2024 | Zhang et al. |
| 2024/0113517 A1 | 4/2024 | Sriraj et al. |
| 2024/0113611 A1 | 4/2024 | Kaufmann et al. |
| 2024/0113620 A1 | 4/2024 | Ranmuthu et al. |
| 2024/0113624 A1 | 4/2024 | Southard et al. |
| 2024/0120558 A1 | 4/2024 | Zhang et al. |
| 2024/0120765 A1 | 4/2024 | Oner et al. |
| 2024/0120962 A1 | 4/2024 | Miriyala et al. |
| 2024/0128851 A1 | 4/2024 | Ruck et al. |
| 2024/0128859 A1 | 4/2024 | Chen |
| 2024/0128867 A1 | 4/2024 | Wang et al. |
| 2024/0146177 A1 | 5/2024 | Mehdi et al. |
| 2024/0146306 A1 | 5/2024 | Ramkaj et al. |
| 2024/0149734 A1 | 5/2024 | Eisenlauer |
| 2024/0162723 A1 | 5/2024 | Zipf et al. |
| 2024/0178756 A1 | 5/2024 | El-Markhi et al. |
| 2024/0178824 A1 | 5/2024 | Kazama et al. |
| 2024/0186803 A1 | 6/2024 | Krieg et al. |
| 2024/0198937 A1 | 6/2024 | Benqassmi et al. |
| 2024/0198938 A1 | 6/2024 | Carlos et al. |
| 2024/0204540 A1 | 6/2024 | Majmunovic et al. |
| 2024/0204541 A1 | 6/2024 | Majmunovic et al. |

(56) References Cited

U.S. PATENT DOCUMENTS

| | | |
|---|---|---|
| 2024/0204671 A1 | 6/2024 | Liu et al. |
| 2024/0204765 A1 | 6/2024 | Dake |
| 2024/0213874 A1 | 6/2024 | Junnarkar et al. |
| 2024/0213971 A1 | 6/2024 | Lee |
| 2024/0213975 A1 | 6/2024 | Narayanasamy |
| 2024/0213981 A1 | 6/2024 | Agarwal et al. |

FOREIGN PATENT DOCUMENTS

| | | |
|---|---|---|
| WO | 2019034505 A1 | 2/2019 |
| WO | 2020156820 A1 | 8/2020 |
| WO | 2020239797 A1 | 12/2020 |
| WO | 2021110405 A1 | 6/2021 |
| WO | 2021213728 A1 | 10/2021 |
| WO | 2022012943 A1 | 1/2022 |
| WO | 2022229149 A1 | 11/2022 |
| WO | 2023006491 A1 | 2/2023 |
| WO | 2023046607 A1 | 3/2023 |
| WO | 2023094053 A1 | 6/2023 |
| WO | 2023110991 A1 | 6/2023 |
| WO | 2023147907 A1 | 8/2023 |
| WO | 2023151850 A1 | 8/2023 |
| WO | 2023227278 A1 | 11/2023 |
| WO | 2023237248 A1 | 12/2023 |
| WO | 2024006181 A2 | 1/2024 |
| WO | 2024012743 A1 | 1/2024 |
| WO | 2024012744 A1 | 1/2024 |
| WO | 2024022219 A1 | 2/2024 |
| WO | 2024041776 A1 | 2/2024 |
| WO | 2024046614 A1 | 3/2024 |
| WO | 2024049730 A1 | 3/2024 |
| WO | 2024049884 A1 | 3/2024 |
| WO | 2024049909 A1 | 3/2024 |
| WO | 2024056388 A1 | 3/2024 |
| WO | 2024068065 A1 | 4/2024 |
| WO | 2024068076 A1 | 4/2024 |
| WO | 2024068113 A1 | 4/2024 |
| WO | 2024068115 A1 | 4/2024 |
| WO | 2024083391 A1 | 4/2024 |
| WO | 2024093384 A1 | 5/2024 |
| WO | 2024104970 A1 | 5/2024 |
| WO | 2024108401 A1 | 5/2024 |
| WO | 2024110106 A1 | 5/2024 |
| WO | 2024110265 A1 | 5/2024 |
| WO | 2024110297 A1 | 5/2024 |
| WO | 2024114978 A1 | 6/2024 |
| WO | 2024114979 A1 | 6/2024 |
| WO | 2024114980 A1 | 6/2024 |
| WO | 2024128286 A1 | 6/2024 |
| WO | 2024132249 A1 | 6/2024 |

OTHER PUBLICATIONS

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/ieee/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

* cited by examiner

SYSTEMS AND METHODS FOR ADAPTIVE DRIVER FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for an adaptive driver for an inverter for an electric vehicle, and, more particularly, to systems and methods for an adaptive driver for a power device switch for an inverter for an electric vehicle.

BACKGROUND

Inverters, such as those used to drive a motor in an electric vehicle, for example, are responsible for converting High Voltage Direct Current (HVDC) into Alternating Current (AC) to drive the motor. In an inverter, parameter drift of a power device switch can compromise the correct operation of the inverter.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: a power switch including a drain terminal, a source terminal, and a gate terminal; and one or more controllers configured to: receive one or more signals related to an operation of the power switch, update one or more state definitions based on the received one or more signals, and control a gate control signal to the gate terminal based on the updated one or more state definitions.

In some aspects, the techniques described herein relate to a system, wherein the one or more controllers includes one or more point-of-use controllers on a power module with the power switch.

In some aspects, the techniques described herein relate to a system, wherein the drain terminal of the power switch is configured to be connected to a positive terminal of the battery, and the source terminal of the power switch is configured to be connected to a phase terminal of the motor.

In some aspects, the techniques described herein relate to a system, wherein the source terminal of the power switch is configured to be connected to a negative terminal of the battery, and the drain terminal of the power switch is configured to be connected to a phase terminal of the motor.

In some aspects, the techniques described herein relate to a system, wherein the one or more controllers includes: a high speed gate-to-source voltage detector connected to the gate terminal and the source terminal of the power switch, the high speed gate-to-source voltage detector configured to detect a gate-to-source voltage of the power switch as the one or more signals.

In some aspects, the techniques described herein relate to a system, wherein the one or more controllers further includes: an M-bit flash thermometer analog-to-digital converter configured to receive an analog gate-to-source voltage signal from the high speed gate-to-source voltage detector and generate a digital gate-to-source voltage signal.

In some aspects, the techniques described herein relate to a system, wherein the one or more controllers further includes: an adaptive driver controller configured to receive the digital gate-to-source voltage signal from the M-bit flash thermometer analog-to-digital converter, update the one or more state definitions based on the received digital gate-to-source voltage signal, and control the gate control signal to the gate terminal based on the updated one or more state definitions.

In some aspects, the techniques described herein relate to a system, wherein the one or more signals includes one or more of a temperature of the power switch, a current-sense of the power switch, a current-sense di/dt of the power switch, thermal and/or layout constants, a threshold, or a voltage.

In some aspects, the techniques described herein relate to a system, further including: the battery configured to supply the DC power to the inverter; and the motor configured to receive the AC power from the inverter to drive the motor.

In some aspects, the techniques described herein relate to a system including: a power module for an inverter for an electric vehicle, the power module including: a drain connection; a source connection; a power switch including a drain terminal, a source terminal, and a gate terminal, the power switch configured to control a flow of current between the drain connection and the source connection; and one or more point-of-use controllers configured to: receive one or more signals related to an operation of the power switch, update one or more state definitions based on the received one or more signals, and control a gate control signal to the gate terminal based on the updated one or more state definitions.

In some aspects, the techniques described herein relate to a system, wherein the one or more point-of-use controllers includes: a high speed gate-to-source voltage detector connected to the gate terminal and the source terminal of the power switch, the high speed gate-to-source voltage detector configured to detect a gate-to-source voltage of the power switch as the one or more signals.

In some aspects, the techniques described herein relate to a system, wherein the one or more controllers further includes: an M-bit flash thermometer analog-to-digital converter configured to receive an analog gate-to-source voltage signal from the high speed gate-to-source voltage detector and generate a digital gate-to-source voltage signal.

In some aspects, the techniques described herein relate to a system, wherein the one or more controllers further includes: an adaptive driver controller configured to receive the digital gate-to-source voltage signal from the M-bit flash thermometer analog-to-digital converter, update the one or more state definitions based on the received digital gate-to-source voltage signal, and control the gate control signal to the gate terminal based on the updated one or more state definitions.

In some aspects, the techniques described herein relate to a system, wherein the one or more signals includes one or more of a temperature of the power switch, a current-sense of the power switch, a current-sense di/dt of the power switch, thermal and/or layout constants, a threshold, or a voltage.

In some aspects, the techniques described herein relate to a system including: one or more point-of-use controllers for a power module for an inverter, the one or more point-of-use controllers configured to: receive one or more signals related to an operation of a power switch of the power module; update one or more state definitions based on the received one or more signals; and generate a gate control signal for a gate terminal of the power switch, based on the updated one or more state definitions.

In some aspects, the techniques described herein relate to a system, wherein the one or more point-of-use controllers includes: a high speed gate-to-source voltage detector connected to the gate terminal and the source terminal of the power switch, the high speed gate-to-source voltage detector configured to detect a gate-to-source voltage of the power switch as the one or more signals.

In some aspects, the techniques described herein relate to a system, wherein the one or more point-of-use controllers further includes: an M-bit flash thermometer analog-to-digital converter configured to receive an analog gate-to-source voltage signal from the high speed gate-to-source voltage detector and generate a digital gate-to-source voltage signal.

In some aspects, the techniques described herein relate to a system, wherein the one or more point-of-use controllers further includes: an adaptive driver controller configured to receive the digital gate-to-source voltage signal from the M-bit flash thermometer analog-to-digital converter, update the one or more state definitions based on the received digital gate-to-source voltage signal, and control the gate control signal to the gate terminal based on the updated one or more state definitions.

In some aspects, the techniques described herein relate to a system, wherein the one or more signals includes one or more of a temperature of the power switch, a current-sense of the power switch, a current-sense di/dt of the power switch, thermal and/or layout constants, a threshold, or a voltage.

In some aspects, the techniques described herein relate to a system, wherein the one or more state definitions includes one or more of a temperature adjusted state definition, a threshold-adjusted state definition, or a motor-current adjusted state definition.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
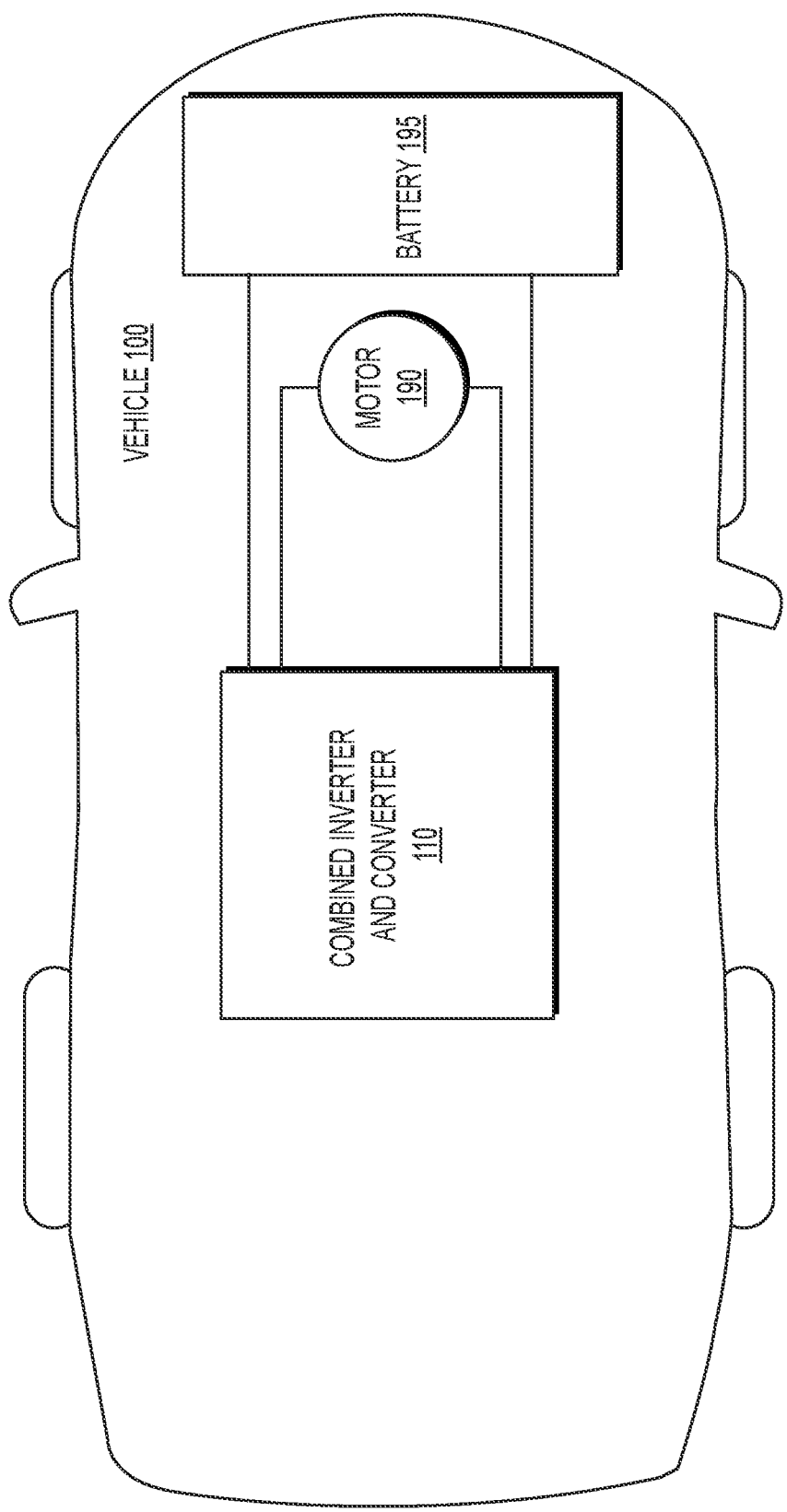
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for an adaptive driver for an inverter for an electric vehicle, and, more particularly, to systems and methods for an adaptive driver for a power device switch for an inverter for an electric vehicle.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three phase switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the phase switches. The phase switches may drive the phase voltage. The inverter may include an isolation barrier between low voltage and high voltage planes. Signals may pass from the PWM controller to the phase switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the phase switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5 A to 15 A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

As a power switch temperature changes, switch characteristics, such as threshold voltage and transconductance, also change. As power switches age, a switch threshold voltage may shift. At lower power switch source currents, the power switches may safely be driven more aggressively.

Some gate drive circuits or ICs will slew inverter IGBT or SiC power switch gates with currents resulting from fixed step voltages applied through fixed resistances. This control (1) does not adapt to changes in temperature or threshold voltage over time, and 2) does not adapt to changes in switch currents from one command cycle to the next. Such control may cause design compromises between the competing goals of safe operation and reduced switching losses.

One or more embodiments may provide a configurable digital state machine that interfaces with analog circuitry to closely control switching of power switches or groups of power switches. The digital state machine and associated analog circuitry may provide configurable and predictable power switch gate currents in a piece-wise linear (PWL) fashion, which may provide configurable and predictable power switch gate-to-source voltage over time. One or more embodiments may choose one or more of a current magnitude, duration, or threshold voltage configuration (i.e., PWL segment/state definitions) from measurements at a baseline temperature and power switch threshold to maintain switching losses at a safe minimum at high power switch source currents. This safe minimum may prevent the power switch from experiencing a positive-feedback thermal runaway during switching.

One or more embodiments may adjust a configuration for one or more of a current magnitude, duration, or threshold to maintain consistent and safe source current profiles at temperature excursions from a baseline. One or more embodiments may perform temperature sense and compensation (extrapolation) periodically for one or more power switches. One or more embodiments may use this extrapolated power switch temperature to determine adjustment factors for one or more of a gate current, state duration, or gate threshold definition. One or more embodiments may perform temperature-relevant adjustments in background operations at a comparatively leisurely rate, by an on-chip math engine, as part of one or more controllers. One or more embodiments may adjust configurations for threshold as power switch turn-on thresholds change with age, to maintain consistent and safe source current profiles. One or more embodiments may monitor the gate-to-source voltages of one or more power switches upon each power switch command-on or command-off and determine an effective turn-on threshold. One or more embodiments may perform threshold-relevant adjustments to temperature-adjusted gate-to-source voltage thresholds used by the PWL state machine in background operation, at a comparatively leisurely rate, by an on-chip math engine.

One or more embodiments may provide faster traversal of command-on and command-off profiles at lower power switch source currents to decrease power switch switching losses. One or more embodiments may use a sensing change in current over time (di/dt), a relatively slower ADC current sensing, and configurable mapping to effectively form a transfer function by which temperature-adjusted and threshold-adjusted gate currents and state durations may be further adjusted. High power switch source current may require relatively slow, careful switching. Low power switch source current may allow more aggressive switching, and the faster progression through gate-on and gate-off profiles may safely reduce switching losses.

Sensed motor phase currents may vary greatly from one switch command cycle to the next. One or more embodiments may select gate current and state duration adjustment factors based on a combined function of the maximum of the sensed motor current (which is largest near the peaks and valleys of the motor current waveform) and the motor di/dt (which is largest near the zero-crossings of the motor current waveform). One or more embodiments may quickly perform source-current-relevant adjustments by the on-chip math engine immediately following each power switch command-off.

One or more embodiments may allow driver profiles to autonomously (with no microprocessor intervention) adapt to power switch temperature, threshold, and source current changes to maintain safe operation while increasing vehicle range through reduction of switching losses. One or more embodiments may autonomously maintain safe power switch operation while increasing vehicle range through reduction of switching losses.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
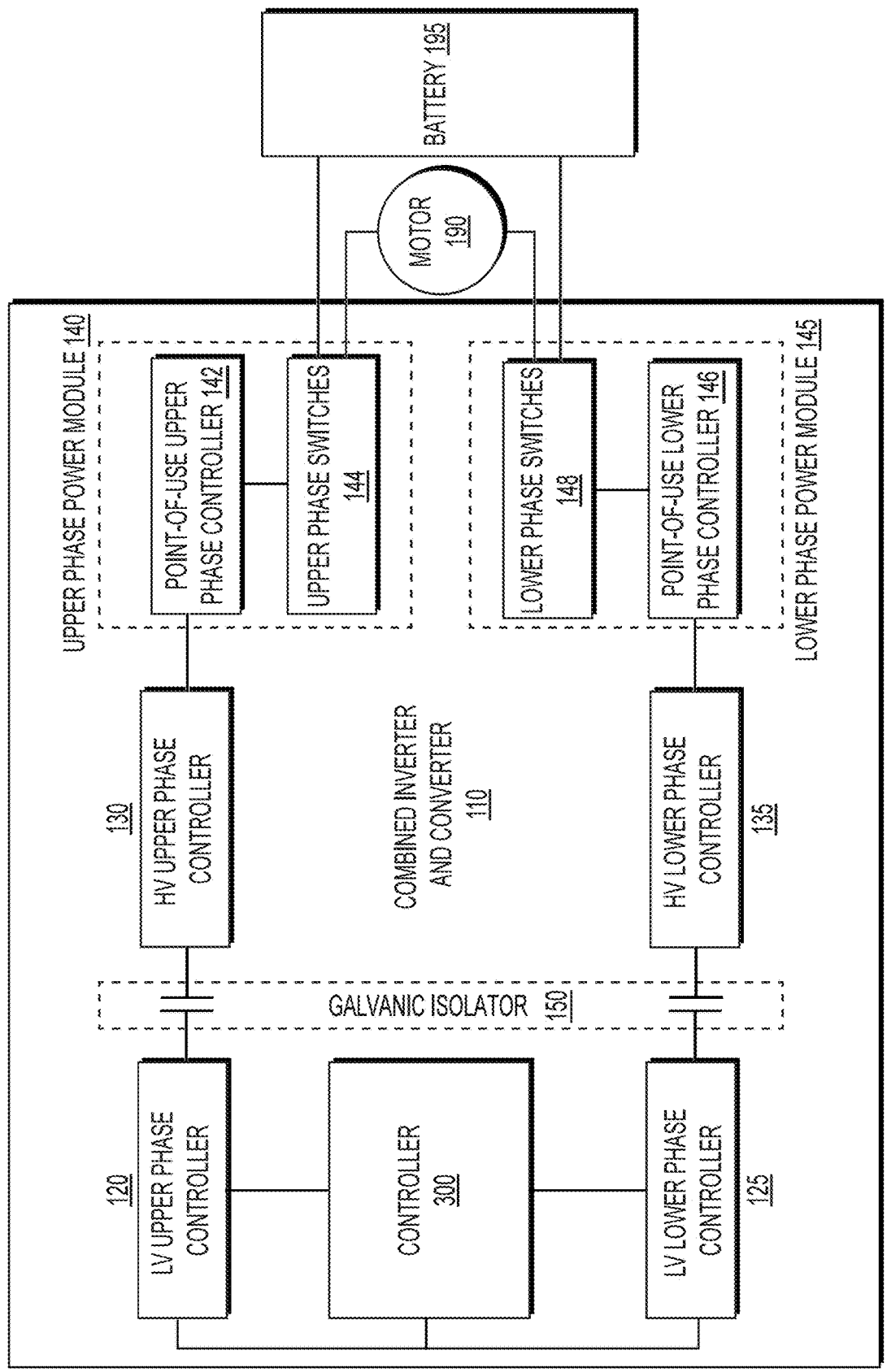
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries a complementary data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
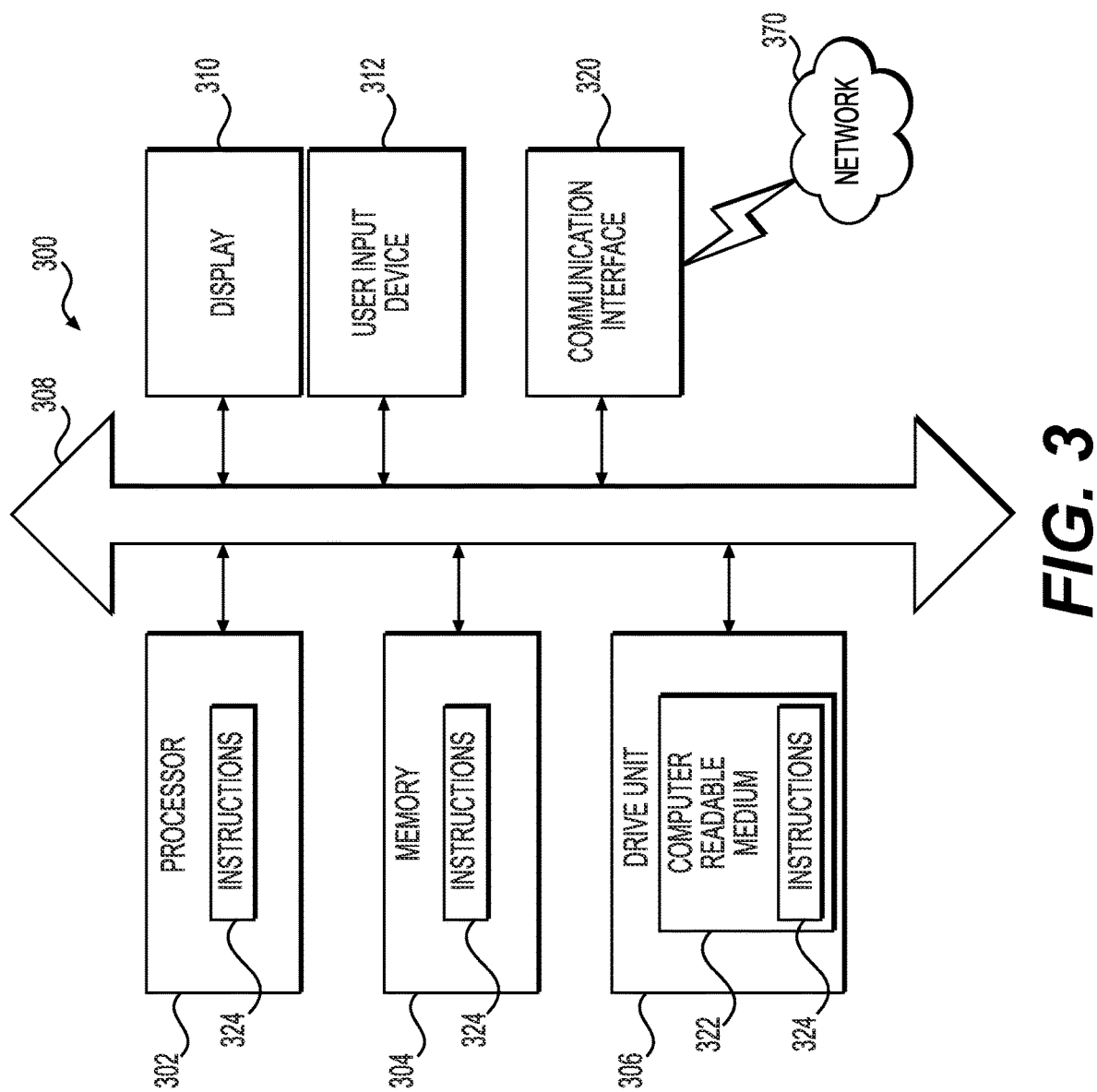
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
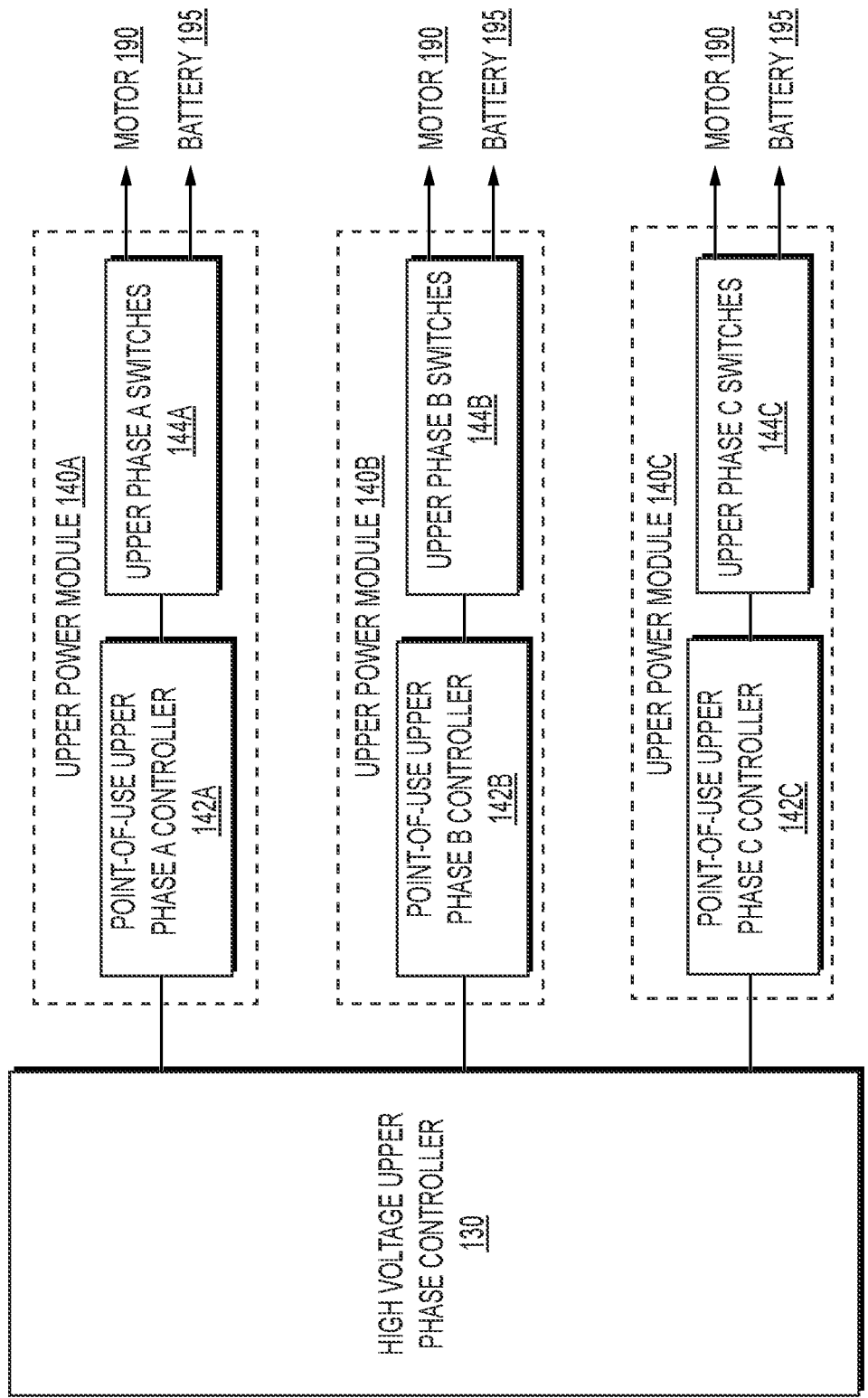
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
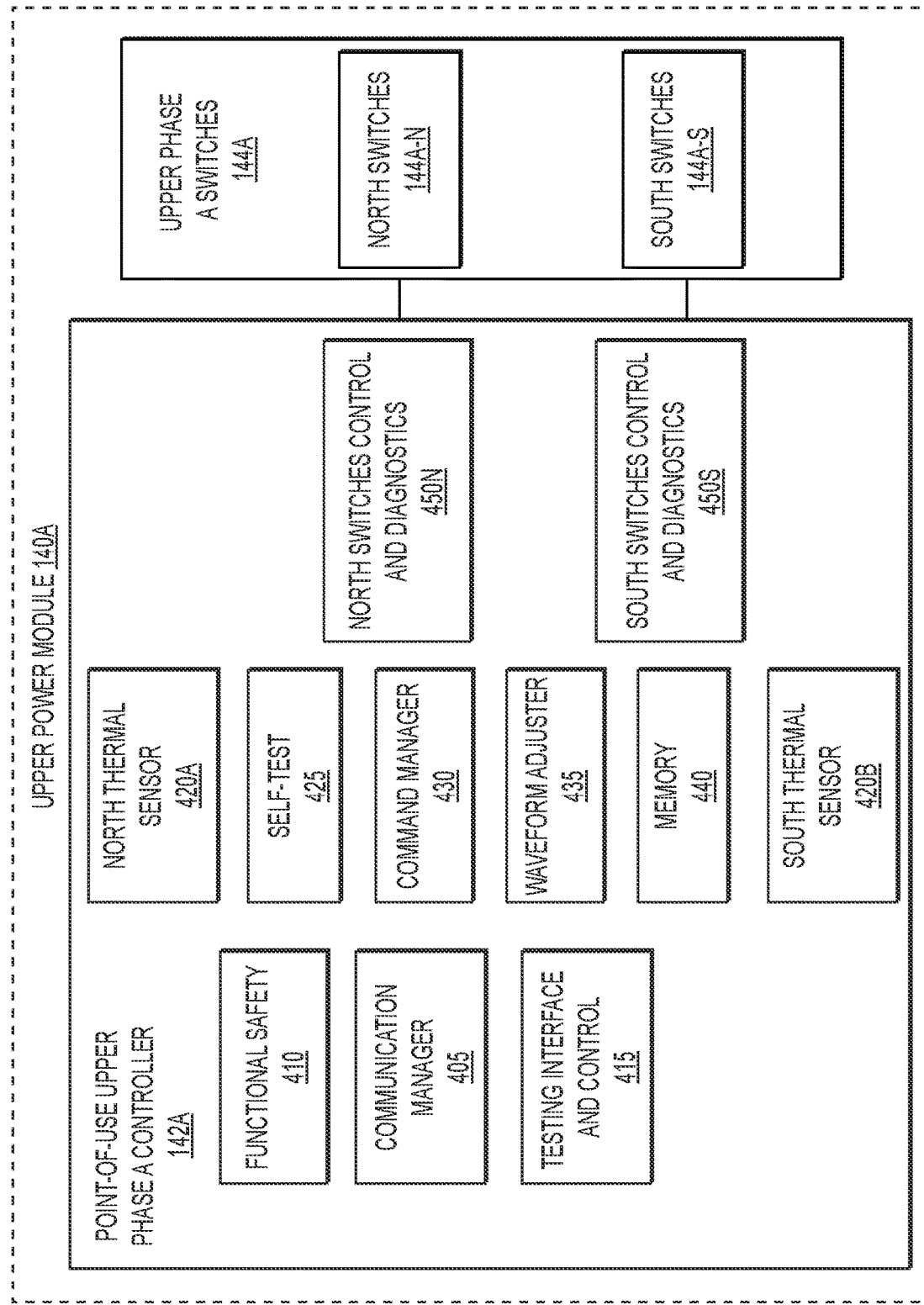
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
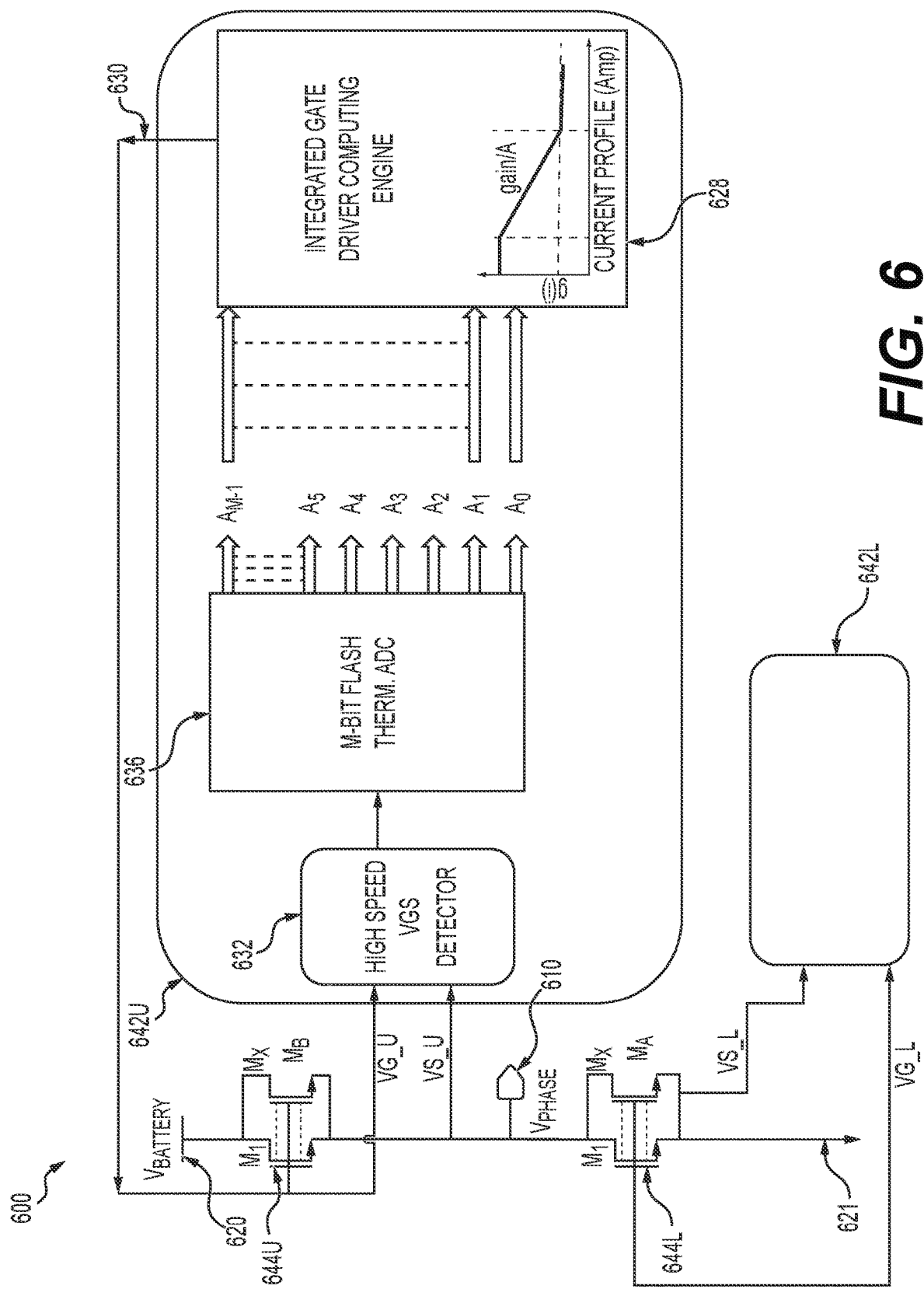
FIG. 6 depicts an exemplary system for an adaptive driver system for a power device switch, according to one or more embodiments.

FIG. 6 depicts an exemplary system for an adaptive driver system for a power device switch. Adaptive driver system 600 may be an implementation of upper phase power module 140 and lower phase power module 145, for example. As shown in FIG. 6, upper power switches 644U (MB) may be an implementation of upper phase A switches 144A, and lower power switches 644L (MA) may be an implementation of lower phase A switches that pair with upper phase A switches 144A. As shown in FIG. 6, point-of-use upper phase controller 642U may be an implementation of point-of-use upper phase A controller 142A, for example, with a corresponding point-of-use lower phase A controller 642L. Even more specifically, point-of-use upper phase controller 642U may be an implementation of north switches control and diagnostics controller 450N, for example.

As shown in FIG. 6, adaptive driver system 600 may include positive battery connection 620 and negative battery connection 621, which may be respective connections from battery 195, for example. Positive battery connection 620 may be connected to drain terminals of upper power switches 644U, the source terminals of upper power switches 644U may be connected to the drain terminals of lower power switches 644L, and the source terminals of lower power switches 644L may be connected to negative battery connection 621. Upper power switches 644U and lower power switches 644L may control a flow of energy from positive battery connection 620 and negative battery connection 621 to phase connection 610, which may be connected to motor 190, for example, to control a rotation of motor 190.

First sensing input VG_U may provide a gate voltage of upper power switches 644U to point-of-use upper phase controller 642U, and second sensing input VS_U may provide a source voltage of upper power switches 644U to point-of-use upper phase controller 642U. Similarly, first sensing input VG_L may provide a gate voltage of lower power switches 644L to point-of-use lower phase controller 642L, and second sensing input VS_L may provide a source voltage of lower power switches 644L to point-of-use lower phase controller 642L. Point-of-use upper phase controller 642U may provide a gate control signal 630 to the gate terminals of upper power switches 644U. Point-of-use upper phase controller 642U may include high speed gate-to-source voltage detector 632, M-bit flash thermometer analog-to-digital converter 636, and adaptive driver controller 628. Adaptive driver controller 628 may be an Integrated Gate Driver Computing Engine (IGDCE).

The high speed gate-to-source voltage detector 632 may receive analog signals from first sensing input VG_U and second sensing input VS_U, and provide analog signals to M-bit flash thermometer analog-to-digital converter 636. M-bit flash thermometer analog-to-digital converter 636 may convert the analog signals from high speed gate-to-source voltage detector 632 and provide digital signals to adaptive driver controller 628. Adaptive driver controller 628 may use the digital signals to determine an optimum next cycle gate-drive PWM drive profile to help minimize the switching losses of the upper power switches 644U, while enabling the reduction of the PWM time duration, along with a reduction of minimum dead time between lower power switches 644L and upper power switches 644U. This optimum next cycle gate-drive PWM drive profile may be provided as a gate control signal 630 to upper power switches 644U.

Figure 7:
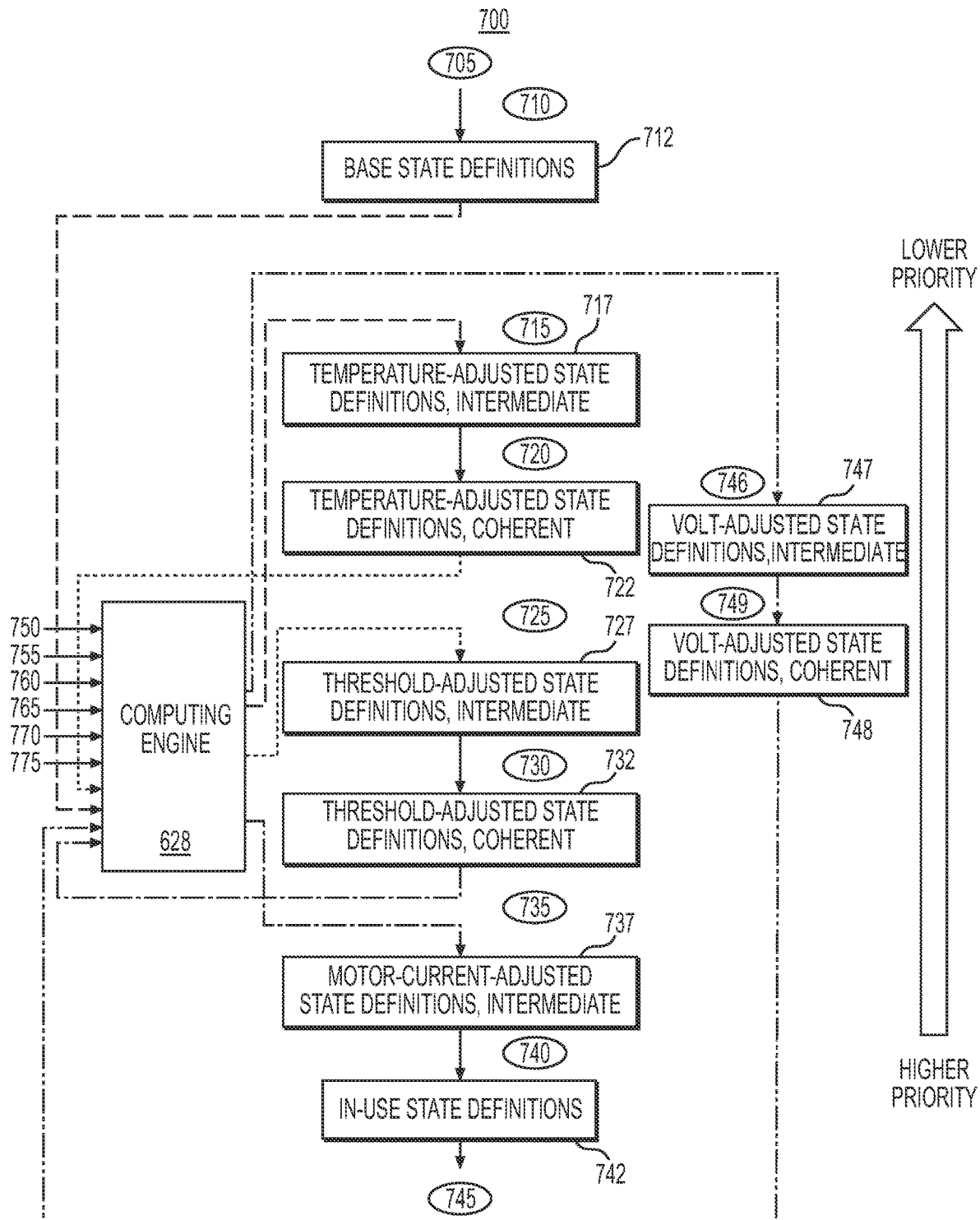
FIG. 7 depicts an exemplary operation of an adaptive driver for a power device switch, according to one or more embodiments.

FIG. 7 depicts an exemplary operation of an adaptive driver for a power device switch, according to one or more embodiments. As shown in FIG. 7, adaptive driver controller 628 may receive one or more input signals. For example, adaptive driver controller 628 may receive one or more of a temperature 750 (e.g. from north thermal sensor 420A and south thermal sensor 420B), current-sense 755 (e.g. from upper power switches 644U), current-sense di/dt 760 (e.g. from upper power switches 644U), thermal and/or layout constants 765 (e.g. from memory 440), a threshold 770, and a voltage 775 (e.g. from battery 195). Adaptive driver controller 628 may control upper power switches 644U as a state machine 700, as shown in FIG. 7. For example, in operation 710, at initialization of the system into base-state definitions 712, adaptive driver controller 628 may populate base state definitions from non-volatile memory 705, such as from memory 440, for example.

In operation 715, while adaptive driver controller 628 is not being used for other higher-priority calculations or adjustments, adaptive driver controller 628 may perform temperature adjustments until all such adjustments are completed and transferred to intermediate temperature-adjusted state definitions 717. Adaptive driver controller 628 may, for example, perform thermal sense compensation when all temperature adjustments are complete, and new reference and sense temperature conversions are available. In operation 720, adaptive driver controller 628 may update all state definitions simultaneously (e.g. in a same clock cycle) when current, duration, and threshold parameters for all states have been adjusted for temperature, and battery voltage threshold adjustments are not currently in progress, as coherent temperature-adjusted state definitions 722. The slow-changing parameters, incorporated into the computation optimum gate drive profiles, may be given lower priority; and conversely, the fast-changing parameters may be treated with higher priority.

In operation 746, while adaptive driver controller 628 is not being used for other higher-priority calculations or adjustments, adaptive driver controller 628 may perform battery voltage adjustments one current or duration parameter at a time until all such adjustments are completed and transferred to intermediate battery voltage-adjusted state definitions 747. In operation 749, adaptive driver controller 628 may update all state definitions simultaneously when current and duration parameters for all states have been adjusted for battery voltage, and turn-on threshold adjustments are not currently in progress, as coherent battery voltage-adjusted state definitions 748.

In operation 725, while adaptive driver controller 628 is not being used for other higher-priority calculations or adjustments, adaptive driver controller 628 may perform threshold adjustments one parameter at a time as intermediate threshold-adjusted state definitions 727 until all such adjustments are completed and transferred to the coherent threshold-adjusted state definitions 732. In operation 730, adaptive driver controller 628 may update all state definitions simultaneously as coherent threshold-adjusted state definitions 732 when threshold parameters for all states have been adjusted for power switch turn-on threshold, and motor current adjustments are not currently in progress.

In operation 735, beginning at power switch command-off, adaptive driver controller 628 may adjust state machine current and duration parameters according to motor current and di/dt one parameter at a time until all are adjusted, as intermediate motor-current-adjusted state definitions 737. In operation 740, adaptive driver controller 628 may update all state definitions simultaneously when current and duration parameters for all states have been adjusted for motor current, as in-use state definitions 742. In operation 745, adaptive driver controller 628 may use the in-use state definitions 742 for gate control signal 630, for example.

As shown in FIG. 7, adaptive driver controller 628 may update state definitions on a scale from a higher priority to a lower priority. For example, intermediate motor-current-adjusted state definitions 737 may be updated with a higher priority than coherent temperature-adjusted state definitions 722, as a motor current variable may change more quickly than a temperature variable, or may have more importance for system control than a temperature variable.

One or more embodiments may provide a configurable digital state machine that interfaces with analog circuitry to closely control switching of power switches or groups of power switches. The digital state machine and associated analog circuitry may provide configurable and predictable power switch gate currents in a piece-wise linear (PWL) fashion, which may provide configurable and predictable power switch gate-to-source voltage over time. One or more embodiments may choose one or more of a current magnitude, duration, or threshold voltage configuration (i.e., PWL segment/state definitions) from measurements at a baseline temperature and power switch threshold to maintain switching losses at a safe minimum at high power switch source currents. This safe minimum may prevent the power switch from experiencing a positive-feedback thermal runaway during switching.

One or more embodiments may adjust a configuration for one or more of a current magnitude, duration, or threshold to maintain consistent and safe source current profiles at temperature excursions from a baseline. One or more embodiments may perform temperature sense and compensation (extrapolation) periodically for one or more power switches. One or more embodiments may use this extrapolated power switch temperature to determine adjustment factors for one or more of a gate current, state duration, or gate threshold definition. One or more embodiments may perform temperature-relevant adjustments in background operations at a comparatively leisurely rate, by an on-chip math engine, as part of one or more controllers. One or more embodiments may adjust configurations for threshold as power switch turn-on thresholds change with age, to maintain consistent and safe source current profiles. One or more embodiments may monitor the gate-to-source voltages of one or more power switches upon each power switch command-on or command-off and determine an effective turn-on threshold. One or more embodiments may perform threshold-relevant adjustments to temperature-adjusted gate-to-source voltage thresholds used by the PWL state machine in background operation, at a comparatively leisurely rate, by an on-chip math engine.

One or more embodiments may provide faster traversal of command-on and command-off profiles at lower power switch source currents to decrease power switch switching losses. One or more embodiments may use a sensing change in current over time (di/dt), a relatively slower ADC current sensing, and configurable mapping to effectively form a transfer function by which temperature-adjusted and threshold-adjusted gate currents and state durations may be further adjusted. High power switch source current may require relatively slow, careful switching. Low power switch source current may allow more aggressive switching, and the faster progression through gate-on and gate-off profiles may safely reduce switching losses.

Sensed motor phase currents may vary greatly from one switch command cycle to the next. One or more embodiments may select gate current and state duration adjustment factors based on a combined function of the maximum of the sensed motor current (which is largest near the peaks and valleys of the motor current waveform) and the motor di/dt (which is largest near the zero-crossings of the motor current waveform). One or more embodiments may quickly perform source-current-relevant adjustments by the on-chip math engine immediately following each power switch command-off.

One or more embodiments may allow driver profiles to autonomously (with no microprocessor intervention) adapt to power switch temperature, threshold, and source current changes to maintain safe operation while increasing vehicle range through reduction of switching losses. One or more embodiments may autonomously maintain safe power switch operation while increasing vehicle range through reduction of switching losses.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
    an inverter configured to convert DC power from a battery to AC power to drive a motor, wherein the inverter includes:
        a power switch including a drain terminal, a source terminal, and a gate terminal; and
        one or more controllers configured to:
            initialize one or more state definitions from a memory;
            receive one or more signals related to an operation of the power switch,
            update, on a scale from a higher priority to a lower priority, the one or more state definitions based on the received one or more signals, and
            control a gate control signal to the gate terminal based on the updated one or more state definitions,
            wherein the one or more state definitions include one or more of a temperature state definition, a threshold state definition, a motor current state definition, or a voltage state definition.

2. The system of claim 1, wherein the one or more controllers includes one or more point-of-use controllers on a power module with the power switch.

3. The system of claim 1, wherein the drain terminal of the power switch is configured to be connected to a positive terminal of the battery, and the source terminal of the power switch is configured to be connected to a phase terminal of the motor.

4. The system of claim 1, wherein the source terminal of the power switch is configured to be connected to a negative terminal of the battery, and the drain terminal of the power switch is configured to be connected to a phase terminal of the motor.

5. The system of claim 1, wherein the one or more controllers includes:
    a high speed gate-to-source voltage detector connected to the gate terminal and the source terminal of the power switch, the high speed gate-to-source voltage detector configured to detect a gate-to-source voltage of the power switch as the one or more signals.

6. The system of claim 5, wherein the one or more controllers further includes:
    an M-bit flash thermometer analog-to-digital converter configured to receive an analog gate-to-source voltage signal from the high speed gate-to-source voltage detector and generate a digital gate-to-source voltage signal.

7. The system of claim 6, wherein the one or more controllers further includes:
    an adaptive driver controller configured to receive the digital gate-to-source voltage signal from the M-bit flash thermometer analog-to-digital converter, update the one or more state definitions based on the received digital gate-to-source voltage signal, and control the gate control signal to the gate terminal based on the updated one or more state definitions.

8. The system of claim 1, wherein the one or more signals includes one or more of a temperature of the power switch, a current-sense of the power switch, a current-sense di/dt of the power switch, thermal and/or layout constants, a threshold, or a voltage.

9. The system of claim 1, further comprising:
    the battery configured to supply the DC power to the inverter; and
    the motor configured to receive the AC power from the inverter to drive the motor.

10. A system including:
    a power module for an inverter for an electric vehicle, the power module comprising:
        a drain connection;
        a source connection;
        a power switch including a drain terminal, a source terminal, and a gate terminal, the power switch configured to control a flow of current between the drain connection and the source connection; and
        one or more point-of-use controllers configured to:
            initialize one or more state definitions from a memory;
            receive one or more signals related to an operation of the power switch,
            update, on a scale from a higher priority to a lower priority, the one or more state definitions based on the received one or more signals, and
            control a gate control signal to the gate terminal based on the updated one or more state definitions,
            wherein the one or more state definitions include one or more of a temperature state definition, a threshold state definition, a motor current state definition, or a voltage state definition.

11. The system of claim 10, wherein the one or more point-of-use controllers includes:
    a high speed gate-to-source voltage detector connected to the gate terminal and the source terminal of the power switch, the high speed gate-to-source voltage detector configured to detect a gate-to-source voltage of the power switch as the one or more signals.

12. The system of claim 11, wherein the one or more controllers further includes:
    an M-bit flash thermometer analog-to-digital converter configured to receive an analog gate-to-source voltage signal from the high speed gate-to-source voltage detector and generate a digital gate-to-source voltage signal.

13. The system of claim 12, wherein the one or more controllers further includes:
    an adaptive driver controller configured to receive the digital gate-to-source voltage signal from the M-bit flash thermometer analog-to-digital converter, update the one or more state definitions based on the received digital gate-to-source voltage signal, and control the gate control signal to the gate terminal based on the updated one or more state definitions.

14. The system of claim 10, wherein the one or more signals includes one or more of a temperature of the power switch, a current-sense of the power switch, a current-sense di/dt of the power switch, thermal and/or layout constants, a threshold, or a voltage.

15. A system comprising:
one or more point-of-use controllers for a power module for an inverter, the one or more point-of-use controllers configured to:
initialize one or more state definitions from a memory;
receive one or more signals related to an operation of a power switch of the power module;
update, on a scale from a higher priority to a lower priority, the one or more state definitions based on the received one or more signals; and
generate a gate control signal for a gate terminal of the power switch, based on the updated one or more state definitions,
wherein the one or more state definitions include one or more of a temperature state definition, a threshold state definition, a motor current state definition, or a voltage state definition.

16. The system of claim 15, wherein the one or more point-of-use controllers includes:
a high speed gate-to-source voltage detector connected to the gate terminal and the a source terminal of the power switch, the high speed gate-to-source voltage detector configured to detect a gate-to-source voltage of the power switch as the one or more signals.

17. The system of claim 16, wherein the one or more point-of-use controllers further includes:
an M-bit flash thermometer analog-to-digital converter configured to receive an analog gate-to-source voltage signal from the high speed gate-to-source voltage detector and generate a digital gate-to-source voltage signal.

18. The system of claim 17, wherein the one or more point-of-use controllers further includes:
an adaptive driver controller configured to receive the digital gate-to-source voltage signal from the M-bit flash thermometer analog-to-digital converter, update the one or more state definitions based on the received digital gate-to-source voltage signal, and control the gate control signal to the gate terminal based on the updated one or more state definitions.

19. The system of claim 15, wherein the one or more signals includes one or more of a temperature of the power switch, a current-sense of the power switch, a current-sense di/dt of the power switch, thermal and/or layout constants, a threshold, or a voltage.

* * * * *

UNITED STATES PATENT AND TRADEMARK OFFICE
CERTIFICATE OF CORRECTION

| | |
|---|---|
| PATENT NO. | : 12,457,719 B2 |
| APPLICATION NO. | : 18/171084 |
| DATED | : October 28, 2025 |
| INVENTOR(S) | : Peter Allan Laubenstein et al. |

It is certified that error appears in the above-identified patent and that said Letters Patent is hereby corrected as shown below:

In the Claims

In Claim 16, Column 19, Line 24, after "and" delete "the".

Signed and Sealed this
Twenty-third Day of December, 2025

John A. Squires
*Director of the United States Patent and Trademark Office*